(12) United States Patent
Xu et al.

(10) Patent No.: US 9,598,276 B2
(45) Date of Patent: Mar. 21, 2017

(54) MEMS DEVICE AND FORMATION METHOD THEREOF

(71) Applicant: Semiconductor Manufacturing International (Shanghai) Corporation, Shanghai (CN)

(72) Inventors: Wei Xu, Shanghai (CN); Guoan Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 11 days.

(21) Appl. No.: 14/645,741

(22) Filed: Mar. 12, 2015

(65) Prior Publication Data

US 2015/0274507 A1 Oct. 1, 2015

(30) Foreign Application Priority Data

Mar. 25, 2014 (CN) .......................... 2014 1 0113760

(51) Int. Cl.
| | |
|---|---|
| B81B 7/02 | (2006.01) |
| B81B 7/00 | (2006.01) |
| B81C 1/00 | (2006.01) |
| G01P 15/125 | (2006.01) |
| G01L 9/00 | (2006.01) |
| G01P 15/08 | (2006.01) |

(52) U.S. Cl.
CPC ................ B81B 7/007 (2013.01); B81B 7/02 (2013.01); B81C 1/0038 (2013.01); G01L 9/0042 (2013.01); G01P 15/0802 (2013.01); G01P 15/125 (2013.01); *B81B 2201/0235* (2013.01); *B81B 2201/0264* (2013.01); *B81B 2207/07* (2013.01); *B81B 2207/096* (2013.01); *B81C 2203/01* (2013.01)

(58) Field of Classification Search
CPC .......... B81B 7/0074; B81B 2201/0235; B81B 2201/0264; B81B 2207/094; B81B 2207/07; B81C 1/00214
See application file for complete search history.

(56) References Cited

U.S. PATENT DOCUMENTS

2004/0025591 A1* 2/2004 Yoshikawa ............. G01P 15/18
73/514.32
2009/0146227 A1* 6/2009 Igarashi .................... B81B 7/02
257/415

* cited by examiner

*Primary Examiner* — Kimberly Rizkallah
*Assistant Examiner* — Maria Ligai
(74) *Attorney, Agent, or Firm* — Anova Law Group, PLLC

(57) ABSTRACT

The present disclosure provides MEMS devices and their fabrication methods. A first dielectric layer is formed on a substrate including integrated circuits therein. One or more first metal connections and second metal connections are formed in the first dielectric layer and are electrically connected to the integrated circuits. A second dielectric layer is formed on the first dielectric layer. An acceleration sensor is formed in the second dielectric layer to electrically connect to the one or more first metal connections. One or more first metal vias are formed in the second dielectric layer to electrically connect to the second metal connections. A pressure sensor is formed on the second dielectric layer to electrically connect to the first metal vias. The MEMS devices provided by the present disclosure are compact in size through the integration of the acceleration sensor and the pressure sensor.

18 Claims, 10 Drawing Sheets

MEMS DEVICE AND FORMATION METHOD THEREOF

CROSS-REFERENCES TO RELATED APPLICATIONS

This application claims the priority of Chinese patent application No. CN201410113760.3, filed on Mar. 25, 2014, the entire content of which is incorporated herein by reference.

FIELD OF THE DISCLOSURE

The present disclosure relates to the field of Micro-Electro-Mechanical System (MEMS) technology and, more particularly, relates to a MEMS device and formation method thereof.

BACKGROUND

Micro-Electro-Mechanical System (MEMS) technology is a fast growing technology. In the MEMS technology, micro/nano sized materials/structures are designed, fabricated, measured, and controlled to be functional devices. Currently, MEMS devices in the market include acceleration sensors and pressure sensors.

The MEMS acceleration sensors are devices utilizing the inertia property to perform the measurement. Based on sensing principles, the MEMS acceleration sensors can be categorized into different groups, including piezoresistive type, capacitive type, piezoelectric type, tunneling current type, resonant type, thermoelectric type, electromagnetic coupling type, etc. The MEMS acceleration sensors are widely used in the field of consumer electronics such as cell phones, game consoles, and other portable devices. The MEMS acceleration sensors are also widely used in the field of automotive industry, e.g., in the electronic stability control (ESC) and/or the electronic stability program (ESP), such as in the automotive airbags, the vehicle attitude measurements, and the GPS-aided navigation systems. Further, the MEMS acceleration sensors are also used in the fields of military and aerospace, such as in the satellite wireless communications and the missile guidance.

The MEMS pressure sensors are devices used to measure the pressure. Current MEMS pressure sensors include the silicon piezoresistive pressure sensor and the silicon capacitive pressure sensor. The silicon piezoresistive pressure sensor and the silicon capacitive pressure sensor are MEMS sensors formed on the silicon substrates. The MEMS pressure sensors are widely used in automotive electronics such as the tire pressure monitoring systems (TPMS); in consumer electronics such as the tire pressure meters and the sphygmomanometers; in industrial electronics such as the digital pressure meters, the digital flow meters and the industrial supply weightings, etc.

A MEMS pressure sensor usually includes a semiconductor substrate; a bottom electrode located on the semiconductor substrate; a sensing film located above the bottom electrode; a gap formed between the sensing film and the bottom electrode; and supporting structures located on the semiconductor substrate used for supporting the sensing film.

As illustrated above, MEMS sensors are widely used in consumer electronics, automotive electronics, and industrial electronics. However, because of great differences between various sensors in fabrication and packaging, to the date, there are no integrated MEMS sensor products on the market.

For example, although the MEMS acceleration sensors and the MEMS pressure sensors are already used in the TPMS, chips of the MEMS acceleration sensors and the MEMS pressure sensors are first designed and fabricated separately, and then packaged together. Consequently, existing MEMS devices having integrated multiple MEMS sensors may have complicated fabrication process and may be large in the volume with high cost. The disclosed devices and methods are directed to solve one or more problems set forth above and other problems.

BRIEF SUMMARY OF THE DISCLOSURE

One aspect of the present disclosure provides a method for forming a MEMS device. A substrate including integrated circuits therein is provided to form a first dielectric layer on the substrate. One or more first metal connections and second metal connections are formed in the first dielectric layer. The first metal connections and the second metal connections are electrically connected to the integrated circuits. A second dielectric layer is formed on the first dielectric layer. An acceleration sensor is formed in the second dielectric layer to electrically connect to the one or more first metal connections. One or more first metal vias are formed in the second dielectric layer to electrically connect to the second metal connections. A pressure sensor is formed on the second dielectric layer to electrically connect to the first metal vias.

Another aspect of the present disclosure provides a MEMS device. The MEMS device includes a substrate having integrated circuits therein. A first dielectric layer is located on the substrate. One or more first metal connections and second metal connections are formed in the first dielectric layer. The first metal connections and the second metal connections are electrically connected to the integrated circuits. A second dielectric layer is located on the first dielectric layer. An acceleration sensor is formed in the second dielectric layer and electrically connected to the one or more first metal connections. One or more first metal vias are located in the second dielectric layer, and electrically connected to the second metal connections. A pressure sensor is located on the second dielectric layer and electrically connected to the one or more first metal vias.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Fabrication processes of current MEMS acceleration sensors and MEMS pressure sensors are performed on different platforms, and the manufacturing cost is high. When packaging the acceleration sensors and the pressure sensors together to satisfy the requirements of particular applications, the packaged structure may have a large volume and may take up a large space.

The present disclosure provides a MEMS device and formation method thereof. In an exemplary MEMS device formation method, by using a vertical integration approach, an acceleration sensor and a pressure sensor are formed on a substrate, and are electrically connected to integrated circuits formed in the substrate respectively. Integrated fabrication of the acceleration sensor and the pressure sensor is therefore realized. The pressure sensor is formed above the acceleration sensor, such that the pressure sensor and the acceleration sensor do not interfere with each other when in operation. Due to such integration, the overall volume of the formed MEMS device is significantly reduced.

In the exemplary embodiments, the schematic diagrams are enlarged disproportionally to show the specific details of interest more conveniently, which should not limit the scope of the present invention. In addition, the actual three dimensions of length, width and depth are used in the fabrication process.

Figure 20:
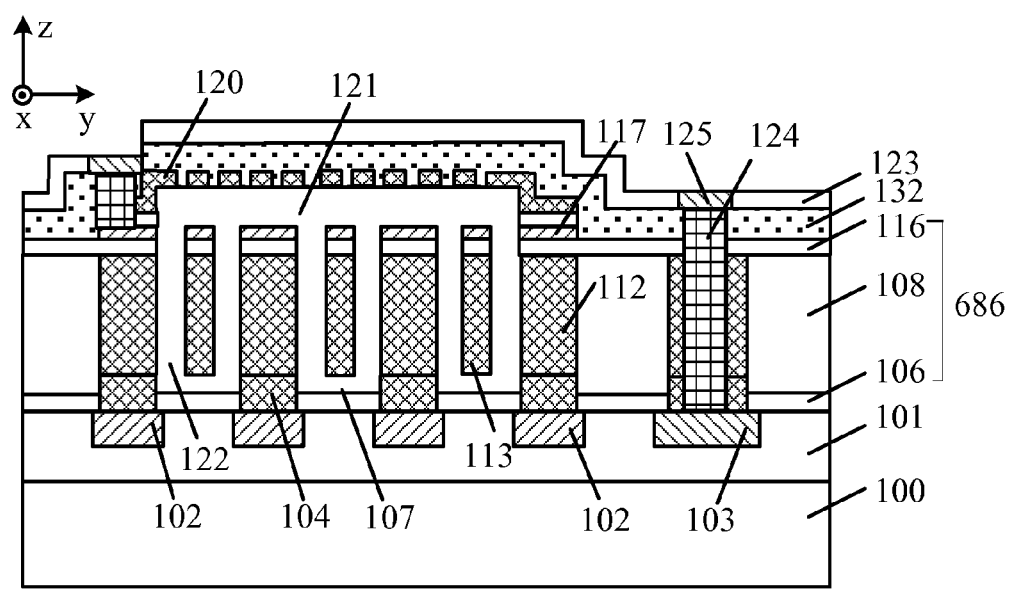
Figure 21:
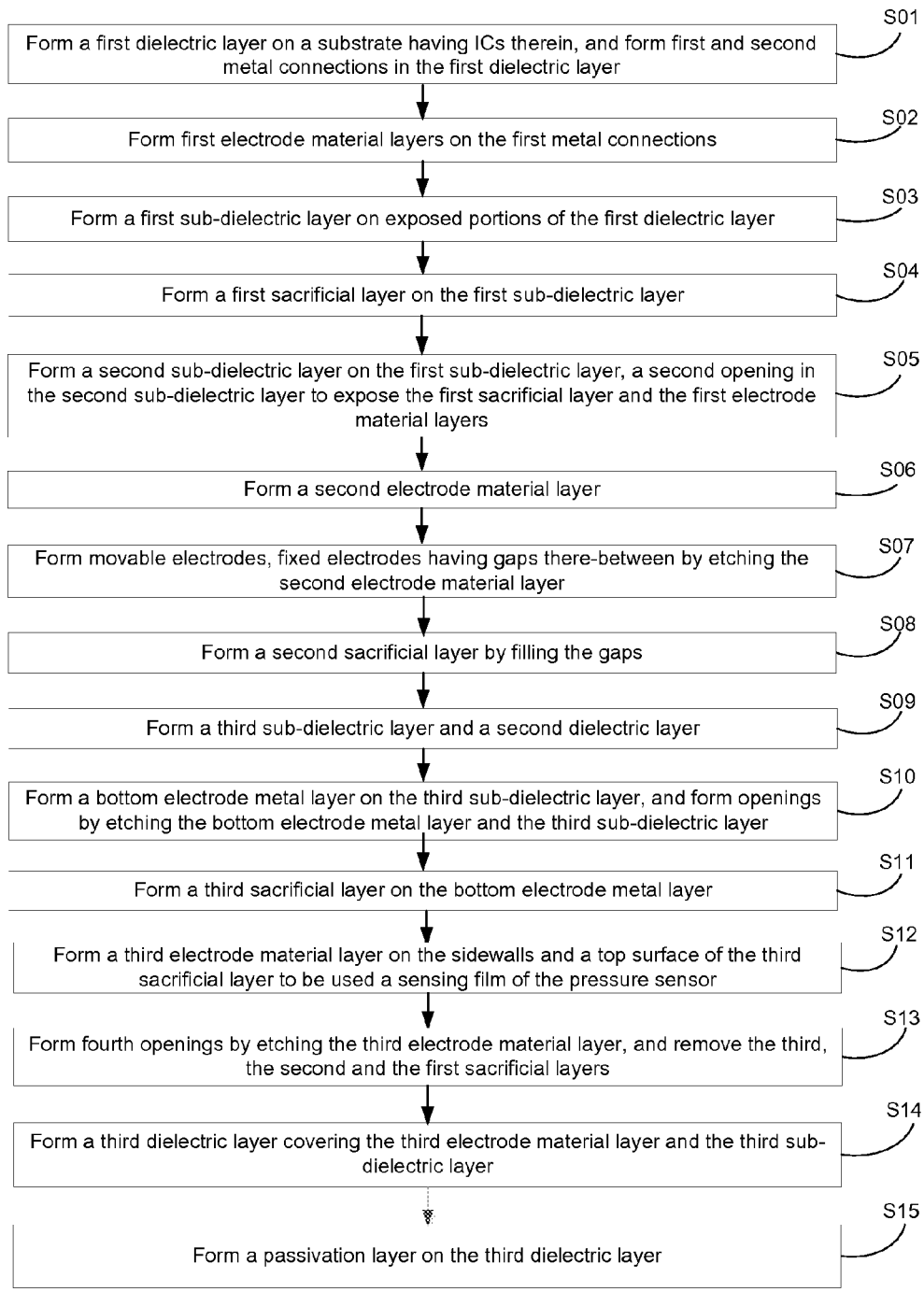
FIG. 21 illustrates a flow chart of an exemplary method for fabricating a MEMS device consistent with various disclosed embodiments.

FIGS. 1-20 illustrate structures of an exemplary MEMS device corresponding to certain stages of a fabrication process consistent with the disclosed embodiments. FIG. 21 illustrates a flow chart of an exemplary MEMS device formation method consistent with the disclosed embodiments.

Figure 1:
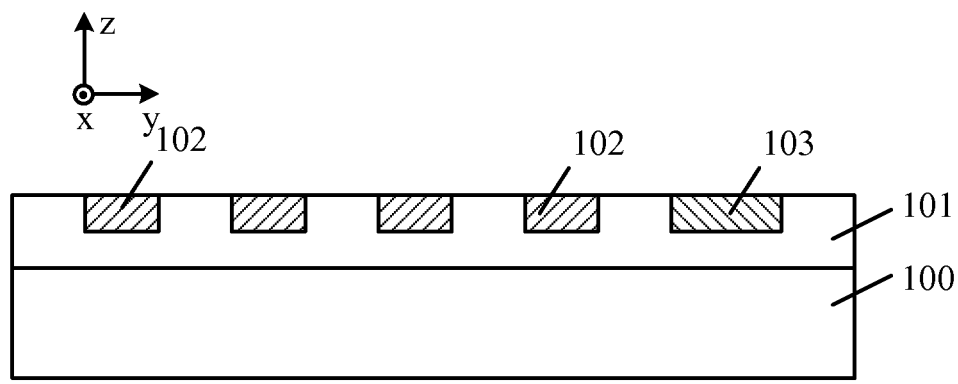
FIGS. 1-20 illustrate structures of an exemplary MEMS device corresponding to certain stages of a fabrication process consistent with various disclosed embodiments.

As shown in FIG. 21, at the beginning of the fabrication process, a substrate having integrated circuits is provided. A first dielectric layer is formed on the substrate, and one or more first metal connections and second metal connections are formed in the first dielectric layer (S01). FIG. 1 illustrates a cross-sectional view of a corresponding structure of the exemplary MEMS device consistent with the disclosed embodiments.

As shown in FIG. 1, a substrate 100 is provided. The substrate 100 may have integrated circuits (not shown) formed therein. Then, a first dielectric layer 101 may be formed on the substrate 100. One or more first metal connections 102 and second metal connections (not shown) may be formed in the first dielectric layer 101. The first metal connections 102 and the second metal connections may be electrically connected to the integrated circuits (not shown) in the substrate 100.

The substrate 100 may be a semiconductor substrate. Certain semiconductor devices (not shown) such as transistors, resistors, capacitors, and/or inductors may be formed in the substrate. The first dielectric layer 101 may be formed on the substrate 100. In addition, certain interconnection structures (not shown) may be formed in the first dielectric layer 101. The interconnection structures may be connected to the semiconductor devices in the substrate 100. The semiconductor devices and the interconnection structures may form the integrated circuits in the substrate 100. Any suitable formation processes of the semiconductor devices and the interconnection structures may be used in the present disclosure.

The integrated circuits may be used to process electrical signals measured by an acceleration sensor and a pressure sensor.

The substrate 100 may be made of any appropriate semiconductor materials, such as silicon, germanium, silicon germanium, silicon carbide, lead telluride, etc. The semiconductor substrate 100 may also be made of any appropriate composite materials, such as silicon on insulator (SOI), germanium on insulator (GOI), etc. The semiconductor substrate 100 may also be made of Group III-V compounds, such as, gallium arsenide, gallium nitride, indium antimonide, indium arsenide, indium phosphide, etc.

The first dielectric layer 101 may have a single layer structure or may have a multilayer structure. The first dielectric layer 101 may be made of silicon oxide, silicon oxynitride, or low-k dielectric materials.

The interconnection structures may be located in the first dielectric layer 101. The interconnection structures may include one or more metal layers and conductive vias for connecting the metal layers in the first dielectric layer 101.

One or more first metal connections 102 and second metal connections (not shown) may be formed in the first dielectric layer 101. The first metal connections 102 and the second metal connections may be electrically connected to portion of the interconnection structures in the first dielectric layer 101 respectively. In addition, the first metal connections 102 may also be electrically connected to the acceleration sensor formed subsequently, and the second metal connections may also be connected to the pressure sensor formed subsequently.

One or more third metal connections 103 may be formed in the first dielectric layer 101. The third metal connections 103 may be electrically connected to one or more of the interconnection structures in the first electrical layer 101. The third metal connections 103 may also be electrically connected to certain second metal vias and first external soldering pads formed subsequently.

The first metal connections 102, the second metal connections, and the third metal connections 103 may be made of aluminum, copper, tungsten, and/or other conductive materials.

In one embodiment, some of the first metal connections 102 may be arranged in parallel along a first direction (e.g., the y axis direction in FIG. 1), and others of the first metal connections 102 (not shown) may be arranged in parallel along a second direction. The second direction may be perpendicular to the first direction. And, in one embodiment, the second direction is the x axis direction.

Figure 2:
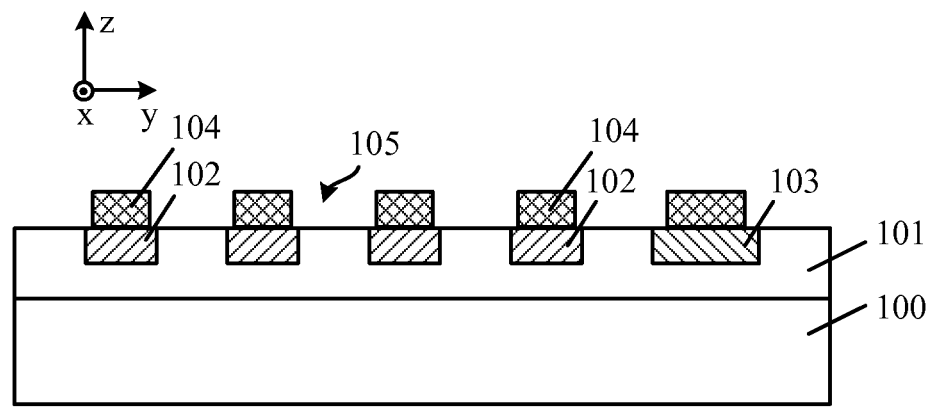

Returning to FIG. 21, one or more first electrode material layers are formed on the first metal connections (S02). FIG. 2 illustrates a cross-sectional view of a corresponding structure of the exemplary MEMS device consistent with the disclosed embodiments.

As shown in FIG. 2, one or more first electrode material layers 104 may be formed on the first metal connections 102. A first opening 105 may be formed between adjacent first electrode material layers 104 and on the dielectric layer 101.

The first electrode material layers 104 may be used as a portion of fixed electrodes of an acceleration sensor subsequently. To form the first electrode material layers 104, a first electrode material film may be formed on the first dielectric layer 101. Then, a patterned photoresist layer may be formed on the first electrode material film. The first electrode material film may be etched using a patterned photoresist layer as a mask to form the first electrode material layers 104 on the first metal interconnections 102.

The first electrode material layers 104 may be made of silicon germanium using a low temperature low pressure chemical vapor deposition (CVD) process. During the low temperature low pressure CVD process, damages to the integrated circuits in the substrate often resulted from a high temperature process may be avoided. The formed first electrode material layers 104 may have significantly low stress. Thus, when using the first electrode material layers 104 as portion of the fixed electrodes, large deformations resulted from large stress may be avoided, and the measuring accuracy of the acceleration sensor may be ensured.

The thickness of the first electrode material layers 104 may range approximately from 4500 angstroms to 5500 angstroms. The stress in the first dielectric material layers 104 may range approximately from −20 MPa to 20 MPa. The low temperature low pressure chemical vapor deposition (CVD) process used for forming the first electrode material layer 104 may use a silicon-containing source gas such as $SiH_4$ or $Si_2H_6$, a germanium-containing source gas such as $GeH_2$, a chamber temperature ranging approximately from 420° C. to 450° C., and a chamber pressure ranging approximately from 200 mTorr to 600 mTorr.

In one embodiment, to increase conductivity of the first electrode material layers 104, the silicon germanium (SiGe) may include impurity ions. The impurity ions may be P-type impurity ions or N-type impurity ions. More specifically, the P-type impurity ions may be boron ions, gallium ions, indium ions, or a combination thereof. The N-type impurity ions may be phosphorus ions, arsenic ions, antimony ions, or a combination thereof. During the low temperature low pressure CVD process, certain impurity source gases containing corresponding impurity elements may be supplied at the same time.

In one embodiment, the boron ions are doped into the SiGe. And, during the low temperature low pressure CVD process, an impurity source gas $B_2H_6$ or $BF_3$ is supplied at the same time.

Each of the first metal connections 102 may have a corresponding first electrode material layer 104 formed thereon. The width of the first electrode material layer 104 may be less than or equal to the width of the corresponding first metal connection 102. Further, the first opening 105 may be formed between two adjacent first electrode material layers 104. And the first opening 105 may expose the surface of the first dielectric layer 101 located between adjacent first metal connections 102.

When forming the first electrode material layers 104 on the first metal connections 102, a SiGe layer may also be formed on the third metal connections 103.

In other embodiments, the first electrode material layers 104 may be formed using other suitable materials or processes, which are encompassed in the present disclosure without limitation.

Figure 3:
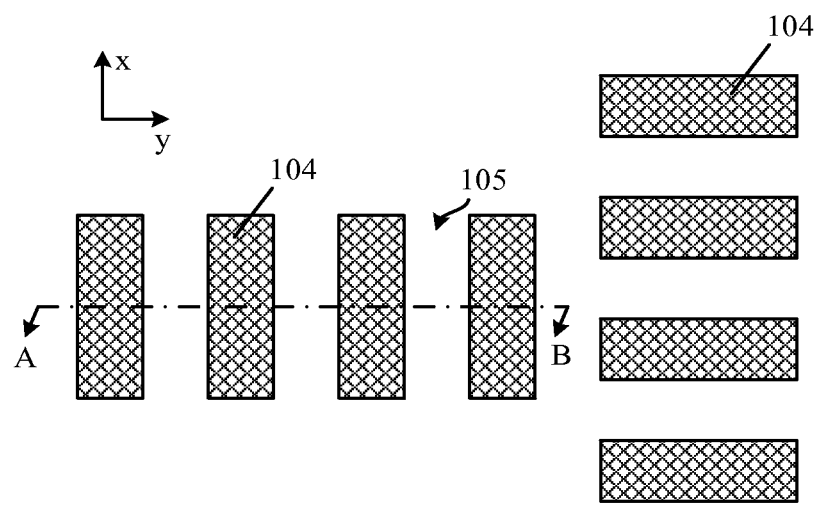

In one embodiment, the first electrode material layers 104 may be arranged along two directions, including a first direction and a second direction. FIG. 3 is a top view of the structure shown in FIG. 2, and FIG. 2 is a sectional view along A-B direction shown in FIG. 3.

As shown in FIGS. 2-3, some of the first electrode material layers 104 may be arranged in parallel along the first direction (e.g., the y axis direction in FIGS. 2-3), and may be electrically connected to the first metal connections 102 arranged along the first direction. Others of the first electrode material layers 104 may be arranged in parallel along the second direction, and may be connected to the first metal connections 102 arranged along the second direction. The second direction may be perpendicular to the first direction. In one embodiment, the second direction is the x axis direction.

In the following fabrication process, certain fixed electrodes and movable electrodes may be formed along the first direction, and certain fixed electrodes and movable electrodes may be formed along the second direction. The fixed electrodes and the movable electrodes may enable the acceleration sensor to measure accelerations along the first direction and the second direction. The way the first electrode material layers 104 is arranged as shown in FIG. 3 is only for illustration purpose, and does not limit the protection scope of the present disclosure. In other embodiments, the first electrode material layers 104 may be arranged in any suitable ways encompassed herein without limitation.

Figure 4:
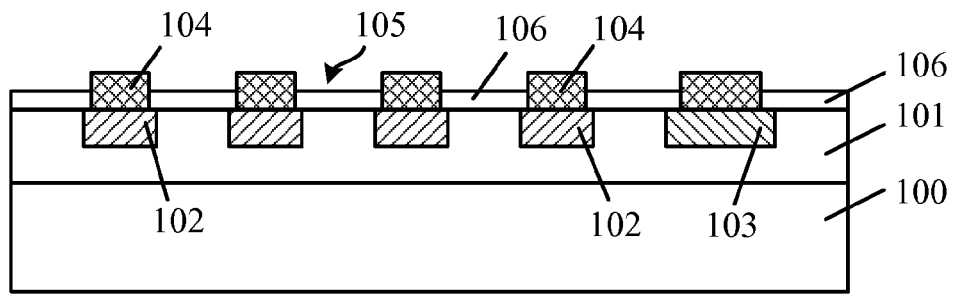

Returning to FIG. 21, a first sub-dielectric layer is formed in the openings and on exposed portions of the first dielectric layer (S03). FIG. 4 illustrates a cross-sectional view of a corresponding structure of the exemplary MEMS device consistent with the disclosed embodiments.

As shown in FIG. 4, a first sub-dielectric layer 106 may be formed in the openings 105 and on the exposed portions of the first dielectric layer 101. A top surface of the first sub-dielectric layer 106 may be lower than the top surface of the first electrode material layers 104.

The first sub-dielectric layer 106 may be used to insulate adjacent first electrode material layers 104, and may be used as a stop layer to subsequently remove a first sacrificial layer.

The first sub-dielectric layer 106 may be made of silicon oxide, silicon nitride, and/or silicon oxynitride. The thickness of the first sub-dielectric layer 106 may range approximately from 800 angstroms to 1200 angstroms.

The process for forming the first sub-dielectric layer 106 may include forming a first sub-dielectric material layer to cover the first dielectric layer 101 and the first electrode material layers 104, and then etching back the first sub-dielectric material layer to form the first sub-dielectric layer 106.

Figure 5:
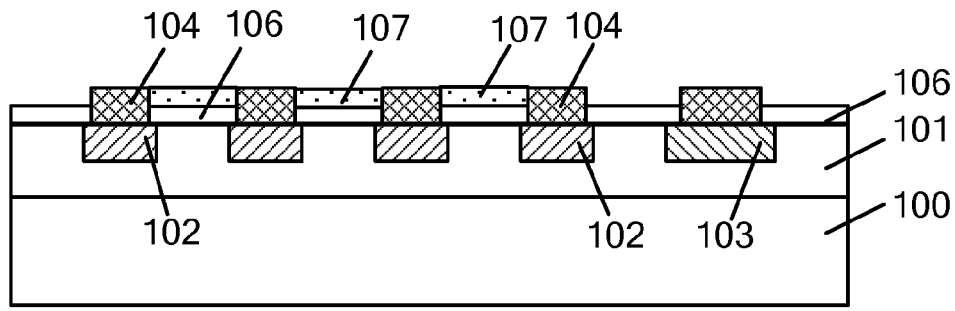

Returning to FIG. 21, a first sacrificial layer is formed in the openings and on the first sub-dielectric layer (S04). FIG. 5 illustrates a cross-sectional view of a corresponding structure of the exemplary MEMS device consistent with the disclosed embodiments.

As shown in FIG. 5, a first sacrificial layer 107 may be formed in the openings 105 of FIG. 4 and on the first sub-dielectric layer 106. A top surface of the first sacrificial layer 107 may be coplanar with the top surface of the first electrode material layers 104.

Arms (or sometimes cantilevers) of the acceleration sensor may be formed on the first sacrificial layer 107 subsequently. Then, by removing the first sacrificial layer 107, the arms may become overhung or suspended arms.

The first sacrificial layer 107 may be made of a different material compared with the first electrode materials layers 104 and the first sub-dielectric layer 106. Thus, when removing the first sacrificial layer 107 subsequently, the etch selectivity between the first sacrificial layer 107, the first electrode material layers 104, and the first sub-dielectric layer 106 may be increased.

In one embodiment, the first sacrificial layer 107 may be made of amorphous carbon. Then, the first sacrificial layer 107 may be removed using a low temperature oxidation process in a furnace tube. Thus, damages to the integrated circuits resulted from a high temperature process may be avoided. Further, during the MEMS device formation process, one or more cavities may be formed. When using the low temperature oxidation process to remove the first sacrificial layer, etching damages resulted from the residuals of etching solutions being left at the cavities during a wet etching process used for removing the first sacrificial layer may also be avoided.

To form the first sacrificial layer 107, a first sacrificial material layer covering the first electrode material layers 104 and the first sub-dielectric layer 106 may be formed first. Then, a chemical mechanical planarization process may be used to flatten the first sacrificial material layer using the top surface of the first electrode material layers 104 as a stop layer to form the first sacrificial layer 107. Next, the first sacrificial layer 107 located outside the first openings 105 may be removed. In other embodiments, the first sacrificial layer 107 located outside the first openings 105 may be kept.

Figure 6:
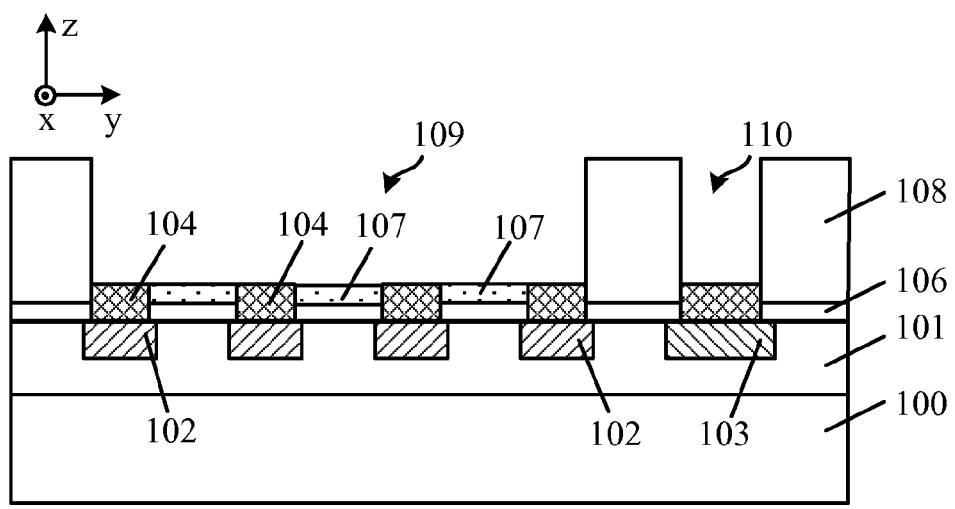

Returning to FIG. 21, a second sub-dielectric layer covering the first sub-dielectric layer is formed, and a second opening in the second sub-dielectric layer exposes surfaces of the first sacrificial layer and the first electrode material layers (S05). FIG. 6 illustrates a cross-sectional view of a corresponding structure of the exemplary MEMS device consistent with the disclosed embodiments.

As shown in FIG. 6, a second sub-dielectric layer 108 may be formed to cover the first sub-dielectric layer 106 and to form a second opening 109 in the second sub-dielectric layer 108. The second opening 109 may expose surfaces of the first sacrificial layer 107 and the first electrode material layers 104.

The second sub-dielectric layer 108 may be made of a material different from that of the first sacrificial layer 107 and the first electrode material layers 104. The second sub-dielectric layer 108 may be made of silicon oxide, silicon nitride, etc.

To form the second sub-dielectric layer 108, a patterned photoresist layer may be formed on a second sub-dielectric material film. Then, the second opening 109 may be formed in the second sub-dielectric material film by etching the second sub-dielectric material film. The formed second opening 109 may expose surfaces of the first sacrificial layer 107 and the first electrode material layers 104. A second electrode material layer may be formed in the second opening 109 subsequently.

When forming the second opening 109, optionally, a sixth opening 110 may be formed in the second sub-dielectric layer 108 and on the third metal connections 103.

Figure 7:
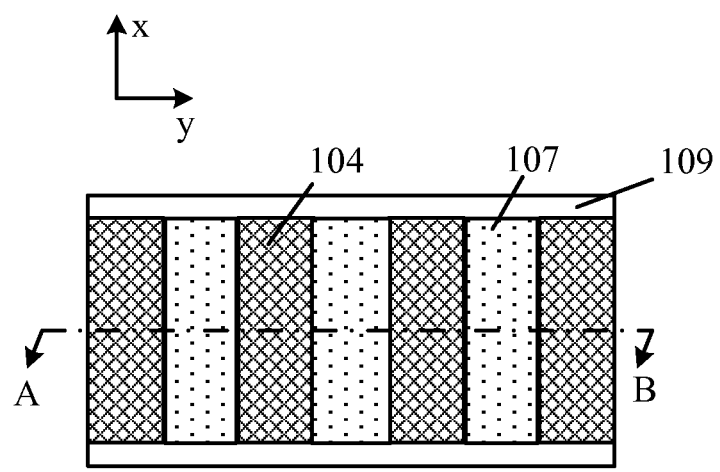

FIG. 7 is a top view of portion of the structure shown in FIG. 6, and FIG. 6 is a cross-sectional view along A-B direction of the structure shown in FIG. 7. As shown in FIGS. 6-7, the width (along the x axis direction) of the second opening 109 may be larger than the width (along the x axis direction) of the first opening 105 (FIG. 2). Thus, the second opening 109 may also expose surface portion of the first sub-dielectric layer 106. When filling the second electrode material layer into the second opening 109, portion of the second electrode material layer may be formed on the first sub-dielectric layer 106. The second dielectric material layer located on the first sub-dielectric layer 106 may be used to form supporting structures of the overhung arms of the acceleration sensor.

Figure 8:
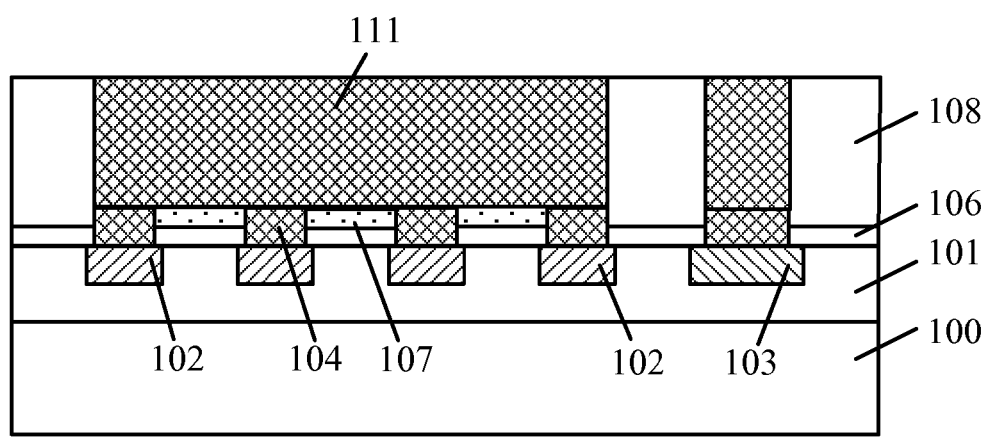

Returning to FIG. 21, a second electrode material layer is formed by filling the second opening (S06). FIG. 8 illustrates a cross-sectional view of a corresponding structure of the exemplary MEMS device consistent with the disclosed embodiments.

As shown in FIG. 8, a second electrode material layer 111 may be formed by filling up the second opening 109 (FIG. 6).

The second material layer 111 may be used to form overhung arms (or movable electrodes) and fixed electrodes of the acceleration sensor subsequently.

The second electrode material layer 111 and the first electrode material layer 104 may be made of the same material using the same forming process. Thus, the second electrode material layer 111 and the first electrode material layer 104 may have the same stress and/or the same type of doping ions. When using the first electrode material layer 104 and a portion of the second electrode material layer 111 to make the fixed electrodes of the acceleration sensor, the formed fixed electrodes may have stable stress and electrical performance.

In one embodiment, the second electrode material layer 111 may be made of silicon germanium by a low temperature low pressure chemical vapor deposition (CVD) process. The low temperature low pressure CVD process may avoid damages to the integrated circuits resulted from a high temperature process. In addition, the formed second electrode material layer 111 may have significantly low stress. Thus, when using the second electrode material layer 111 to form the movable electrodes and fixed electrodes, large deformation of the formed movable electrodes and fixed electrodes because of a large stress may be avoided. The acceleration sensor may have improved detection accuracy. Further, the overhung arms made of the silicon germanium may have desirable restoring capability to return to the original position from an offset status during the detection process.

The thickness of the second electrode material layer 111 may range approximately from 19000 angstroms to 21000 angstroms. The stress in the second electrode material layer 111 may range approximately from −20 MPa to 20 MPa. The low temperature low pressure CVD process for forming the second electrode material layer 111 may use a silicon-containing source gas as such as $SiH_4$ or $Si_2H_6$, and a germanium-containing source gas such as $GeH_2$. The chamber temperature may range from 420° C. to 450° C., and the chamber pressure may range from 200 mTorr to 600 mTorr.

For example, to increase the conductivity of the second electrode material layer 111, impurity ions may be doped into the silicon germanium. The impurity ions may be P-type ions or N-type ions. More specifically, the P-type impurity ions may be boron ions, gallium ions, indium ions, or a combination thereof. And, the N-type impurity ions may be phosphorus ions, arsenic ions, antimony ions, or a combination thereof. When performing the low temperature low pressure CVD process, impurity source gases containing corresponding impurity elements may be supplied at the same time.

In one embodiment, the silicon germanium may be doped with the boron ions. When performing the low temperature low pressure CVD process, an impurity gas containing $B_2H_6$ or $BF_3$ may be supplied. Further, when filling the silicon germanium into the second opening 109 to form the second electrode material layer 111, the sixth opening 110 may also be filled with the silicon germanium.

Figure 9:
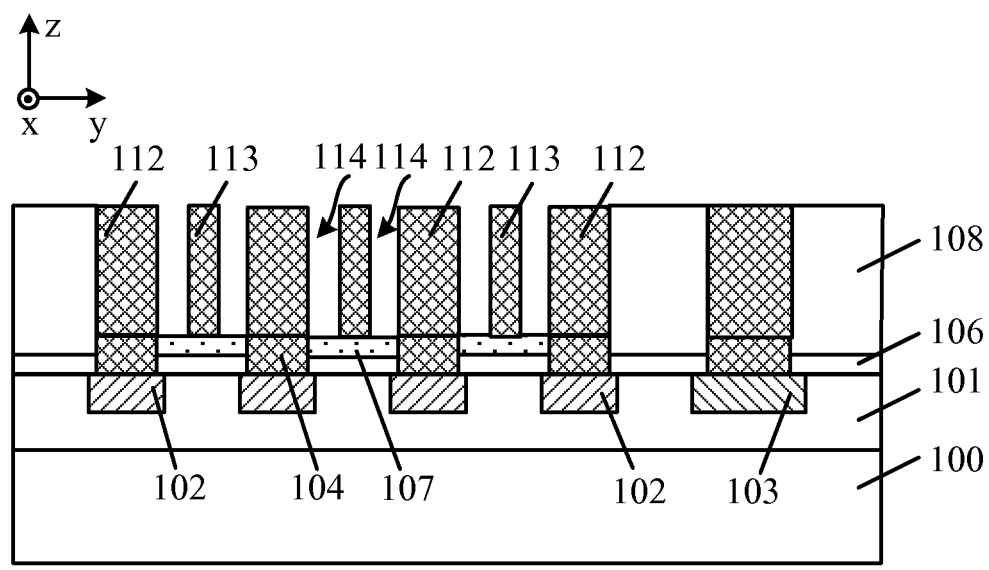

Returning to FIG. 21, movable electrodes, fixed electrodes, and gaps between the movable and fixed electrodes are formed by etching the second electrode material layer (S07). FIG. 9 illustrates a cross-sectional view of a corresponding structure of the exemplary MEMS device consistent with the disclosed embodiments.

As shown in FIG. 9, portion of the second electrode material layer 111 (FIG. 8) located on the first sacrificial layer 107 may be etched away to form arms 113. The arms 113 may be used as the movable electrodes of the acceleration sensor. Further, remaining second electrode material layer 111 located on the first electrode material layers 104 may form fixed electrodes 112 of the acceleration sensor. A gap 114 may be formed between a cantilever 113 and an adjacent fixed electrode 112.

The first electrode material layers 104 may be used as a portion of the fixed electrodes 112. The fixed electrodes 112 may be located on the two opposite sides of the arms 113. The fixed electrodes 112 and the arms 113 may not contact with each other, and may be separate by the gaps 114 formed between a fixed electrode 112 and an adjacent cantilever 113.

Figure 10:
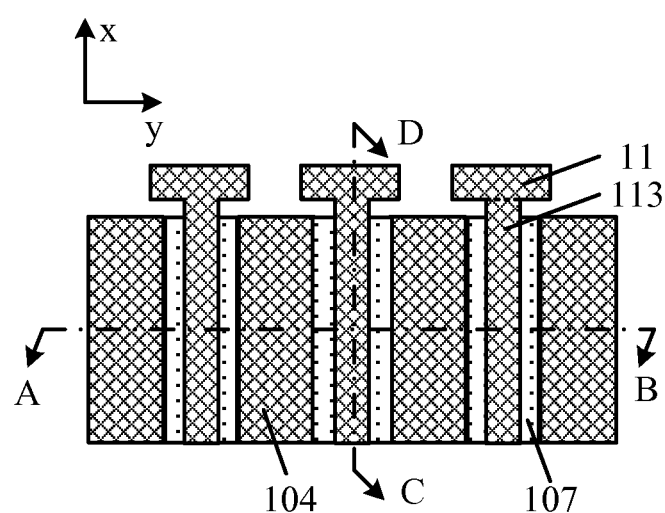

FIG. 10 is a top view of a portion of the structure shown in FIG. 9. FIG. 9 is the A-B sectional view of the structure shown in FIG. 10, and FIG. 11 is the C-D sectional view of the structure shown in FIG. 10.

Figure 11:
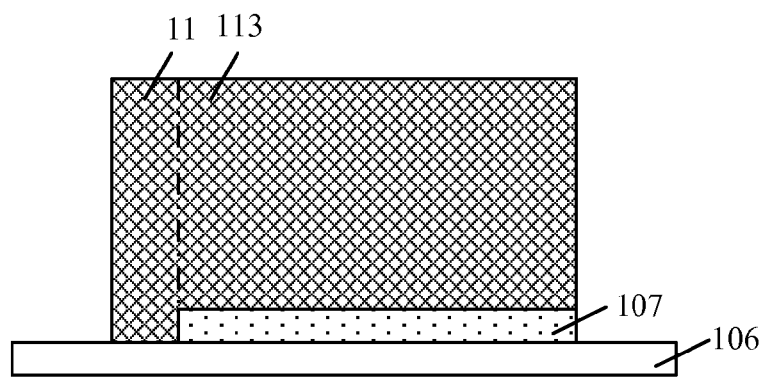

As shown in FIGS. 9-11, when etching the second electrode material layer 111 to form the arms 113, supporting structures 11 for supporting the arms 113 may be formed on a surface portion of the first sub-dielectric layer 106. In the subsequent fabrication process, the first sacrificial layer 107 may be removed to overhang the arms 113.

In one embodiment, some of the arms 113 (e.g., a first plurality of arms) may be arranged in parallel along a first direction (e.g., the y axis direction in FIGS. 9-10), and may be located between the fixed electrodes 112 arranged along the first direction. The first plurality of arms 113 and the fixed electrodes 112 arranged along the first direction may form a first acceleration sensor for detecting acceleration at the first direction.

Some of other arms 113 (e.g., a second plurality of arms, not shown) may be arranged in parallel along a second direction. The second direction may be perpendicular to the first direction. In one embodiment, the second direction is the x axis direction. The second plurality of arms arranged in the second direction may be located between the fixed electrodes arranged along the second direction. The second plurality of arms (not shown) and the fixed electrodes arranged along the second direction may form a second acceleration sensor for detecting acceleration at the second direction.

In one embodiment, before etching the second electrode material layer 111, a patterned mask layer may be formed on the second electrode material layer 111 and on the second sub-dielectric layer 108. The second electrode material layer 111 may be etched using the patterned mask layer as a mask to form the arms 113, the fixed electrodes 112 located on two opposite sides of each arms 113, and the gaps 114 located between each arm 113 and adjacent fixed electrode 112.

Because the second electrode material layer 111 may be relatively thick, to make the formed arms 113 and the fixed electrodes 112 have a better sidewall morphology and a more accurate dimension, an anisotropic plasma etching process may be used to etch the second electrode material layer 111. The improved sidewall morphology and dimension may enhance measuring accuracy of the acceleration sensor.

In one embodiment, the anisotropic plasma etching process may use gases including $CF_4$, HBr, He, and/or $O_2$. The flow rate of $CF_4$ may range approximately from 50 sccm to 150 sccm, the flow rate of HBr may range approximately from 100 sccm to 800 sccm, the flow rate of He may range approximately from 150 sccm to 1000 sccm, and/or the flow rate of $O_2$ may range approximately from 5 sccm to 20 sccm. In addition, the chamber pressure may range approximately from 5 mTorr to 100 mTorr, the power may range approximately from 400 W to 1000 W, and the bias voltage may range approximately from 100 V to 250 V.

Figure 12:
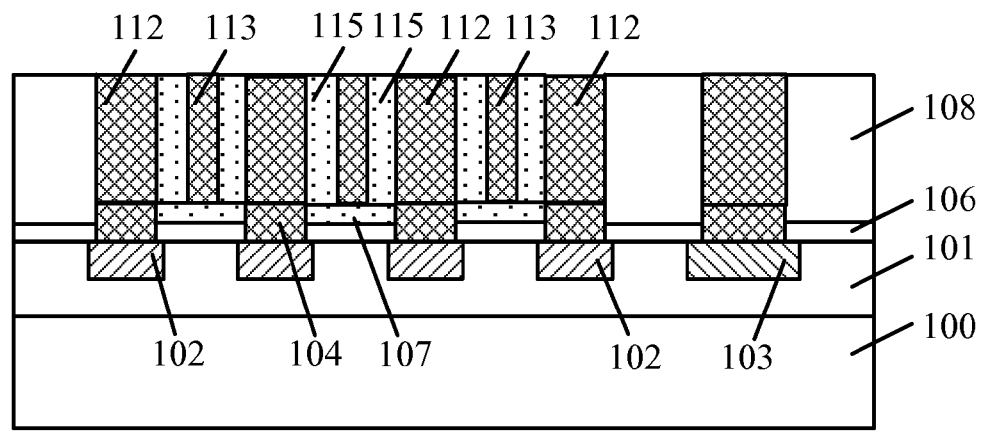

Returning to FIG. 21, a second sacrificial layer is formed by filling the gaps (S08). FIG. 12 illustrates a cross-sectional view of a corresponding structure of the exemplary MEMS device consistent with the disclosed embodiments.

As shown in FIG. 12, a second sacrificial layer 115 may be formed by filling the gaps 114 (FIG. 9).

The second sacrificial layer 115 filled in the gaps 114 may be used to facilitate the subsequent fabrication process of the pressure sensor, and may later be removed to release the arms 113. Further, the second sacrificial layer 115 and the first sacrificial layer 107 may be made of the same material to simplify the subsequent removal process of the sacrificial layers.

In one embodiment, the second sacrificial layer 115 may be made of amorphous carbon. Then, a low temperature tube oxidation process (e.g., a dry process) may be used to remove the second sacrificial layer 115. Thus, damages to the integrated circuits often resulted from high temperature may be avoided. Further, during the MEMS device formation process, one or more cavities may be formed. When using the low temperature tube oxidation process to remove the second sacrificial layer 115, etching damages to the MEMS device often resulted from the residual etching solutions being left at the cavities during a wet etching process used for removing the second sacrificial layer may also be avoided.

To form the second sacrificial layer 115, a second sacrificial material layer covering the arms 113, the fixed electrodes 112, and the second sub-dielectric layer 108 may be formed. The second sacrificial material layer may fill up the gaps 114. Then, a chemical mechanical polishing (CMP) process may be used to planarize (or flatten) the second sacrificial material layer using the surface of the second sub-dielectric layer 108 as a stop layer to form the second sacrificial layer 115.

Figure 13:
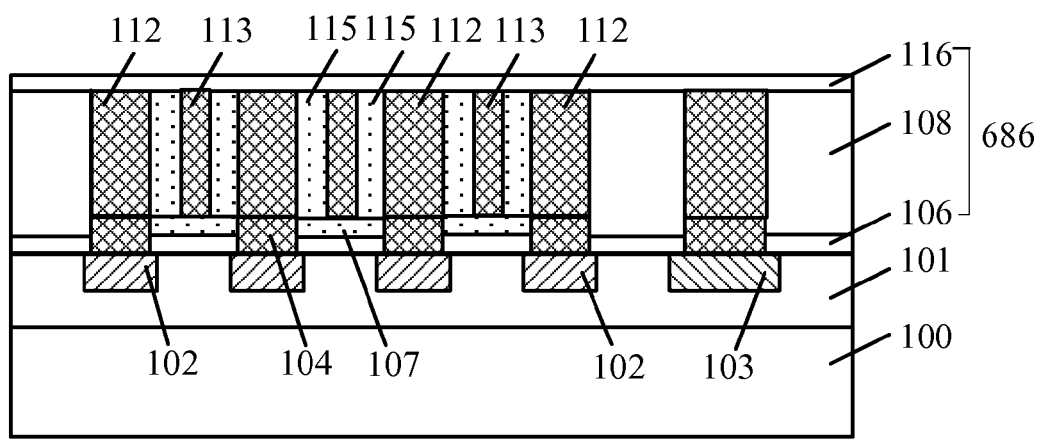

Returning to FIG. 21, a third sub-dielectric layer and a second dielectric layer are formed (S09). FIG. 13 illustrates a cross-sectional view of a corresponding structure of the exemplary MEMS device consistent with the disclosed embodiments.

As shown in FIG. 13, a third sub-dielectric layer 116 may be formed on the arms 113, on the second sacrificial layer 115, and on the second sub-dielectric layer 108. Further, the first sub-dielectric layer 106, the second sub-dielectric layer 108, and the third sub-dielectric layer 116 together may form a second dielectric layer 686.

The third sub-dielectric layer 116 may be used to electrically insulate the fixed electrodes 112 from a bottom electrode metal layer formed subsequently. The third sub-dielectric layer 116 may be made of silicon oxide, silicon nitride, silicon oxynitride, etc. The thickness of the third sub-dielectric layer 116 may range approximately from 1500 angstroms to 2500 angstroms.

After forming the third sub-dielectric layer 116, multiple etching holes (not shown) may be formed in the third sub-dielectric layer 116. The etching holes may expose at least surface portions of the supporting structures 11 and/or the arms 113.

After forming the third sub-dielectric layer 116, the second dielectric layer 686 (e.g., including the first sub-dielectric layer 106, the second sub-dielectric layer 108 and the third sub-dielectric layer 116) may be etched to form a plurality of first metal vias (not shown) in the second dielectric layer 686. The first metal vias may be electrically connected to the second metal connections (not shown). When forming a bottom electrode metal layer or a third electrode material layer subsequently, the bottom electrode metal layer and/or the third electrode material layer may be electrically connected to the plurality of first metal vias. Thus, the electrical connections may be realized between the integrated circuits and the arms 113 of the formed pressure sensor or the formed acceleration sensor.

Figure 14:
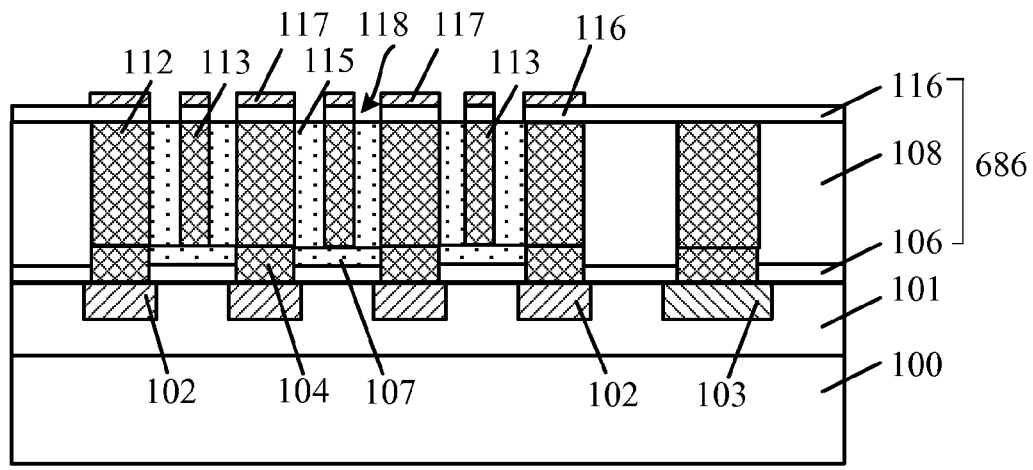

Returning to FIG. 21, a bottom electrode metal layer is formed on the third sub-dielectric layer, and openings are formed by etching the bottom electrode metal layer and the third sub-dielectric layer (S10). FIG. 14 illustrates a cross-sectional view of a corresponding structure of the exemplary MEMS device consistent with the disclosed embodiments.

As shown in FIG. 14, a bottom electrode metal layer 117 may be formed on the third sub-dielectric layer 116 located on the second sacrificial layer 115. The bottom electrode metal layer 117 may be used as the bottom electrode of the pressure sensor. Then, the bottom electrode metal layer 117 and the third sub-dielectric layer 116 may be etched to form multiple third openings 118 in the bottom electrode metal layer 117 and in the third sub-dielectric layer 116 to expose surfaces of the second sacrificial layer 115. In some cases, the positions of the third openings 118 may correspond to the positions of the gaps 114 as shown in FIG. 9.

The bottom electrode metal layer 117 may be made of metal materials such as copper, aluminum, tungsten, etc. In one embodiment, the bottom electrode metal layer 117 may also be made of other suitable conductive materials such as metal nitride or metal silicide.

In one embodiment, the bottom electrode metal layer 117 may be formed by a sputtering process, an electroplating process, or a deposition process. The thickness of the bottom electrode metal layer 117 may range approximately from 7500 angstroms to 8500 angstroms.

When forming the bottom electrode metal layer 117, the bottom electrode metal layer 117 may also fill the etching holes located in the third sub-dielectric layer 116 and on at least some of the arms 113 or the supporting structures 11. Thus, the bottom electrode metal layer 117 may be electrically connected to the arms 113. The bottom electrode metal layer 117 not only becomes the bottom electrode of a pressure sensor, the bottom electrode metal layer 117 may also be electrically connected to the arms 113 of an acceleration sensor. Thus, fabrication of additional metal wires to connect to the cantilevers 113 may be avoided, simplifying the MEMS device structure and the fabrication process.

As described above, after forming the bottom electrode metal layer 117, the third openings 118 may be formed by etching the first metal layer 117 and the third sub-dielectric layer 116. The third openings 118 may expose the underneath second sacrificial layer 115 to contact the subsequently formed third sacrificial layer (e.g., layer 119 in FIG. 15). Through the third openings 118, when removing the third sacrificial layer, the second sacrificial layer 115 and the first sacrificial layer 107 may be removed together to form a first cavity and a second cavity. The positions and width of the third openings 118 may respectively correspond to the positions and width of the gaps 114 as shown in FIG. 9. Thus, the underneath second sacrificial layer 115 and first sacrificial layer 107 may be removed conveniently through the third openings 118 and, when measuring the acceleration, the bottom electrode metal layer 117 located on the arms 113 may not influence the displacement of the arms 113 resulted from the acceleration.

In various embodiments, the bottom electrode metal layer 117 may include a first part and one or more second parts. The second parts may be located on the arms 113, and the first part may be located on the supporting structures 11 and on surface portions of the third sub-dielectric layer 116. The first part and the second parts may be connected. In one embodiment, the bottom electrode metal layer 117 may have a comb structure. The comb structure may include a comb handle and multiple comb teeth connected to the comb handle. The comb handle may correspond to the first part of the bottom electrode metal layer 117. The comb teeth may correspond to the second parts of the bottom electrode metal layer 117.

Prior to etching the bottom electrode metal layer 117, a patterned mask layer may be formed on the bottom electrode metal layer 117. Then, the bottom electrode metal layer 117 and the third sub-dielectric layer 116 may be etched using the patterned mask layer as an etch mask to form the third openings 118.

Figure 15:
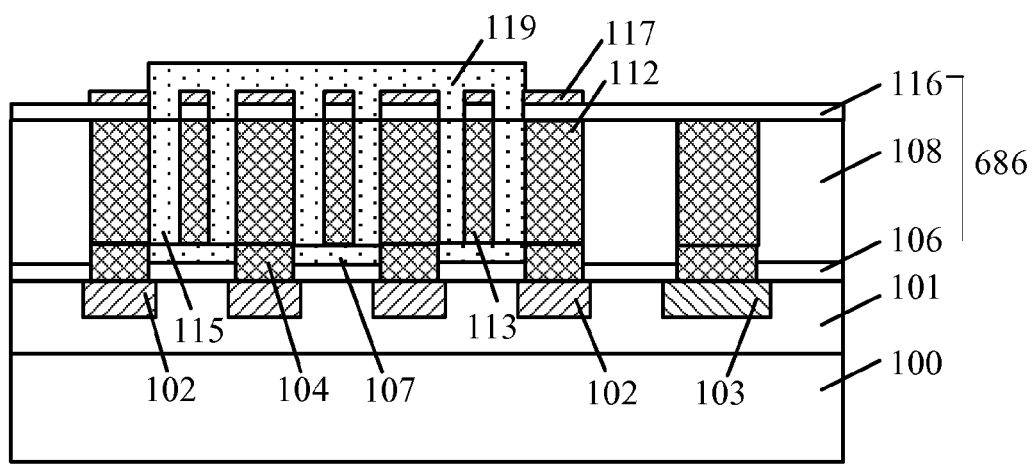

Returning to FIG. 21, a third sacrificial layer is formed on the bottom electrode metal layer, and fills the third openings (S11). FIG. 15 illustrates a cross-sectional view of a corresponding structure of the exemplary MEMS device consistent with the disclosed embodiments.

As shown in FIG. 15, a third sacrificial layer 119 may be formed on the bottom electrode metal layer 117. The third sacrificial layer 119 may fill the third openings 118 (as shown in FIG. 14) between adjacent stacks including the bottom electrode metal layer 117 and the third sub-dielectric layer 116.

The third sacrificial layer 119 may fill the third openings 118 to contact the underneath second sacrificial layer 115. The top surface of the third sacrificial layer 119 may be higher than the top surface of the bottom electrode metal layer 117. The thickness of the third sacrificial layer 119 may range approximately from 19000 angstroms to 21000 angstroms. A second cavity of the pressure sensor may be subsequently formed after removing the third sacrificial layer 119.

The third sacrificial layer 119 and the second sacrificial layer 115 may be made of same material to simplify the subsequent removal process.

In one embodiment, the third sacrificial layer 119 may be made of amorphous carbon. When the third sacrificial layer 119 is made of amorphous carbon, the third sacrificial layer 119 may be removed by a low temperature tube oxidation process to prevent damages to the integrated circuits as compared with a removal process resulted from a high temperature. Further, during the MEMS device formation process, one or more cavities may be formed. When using the low temperature tube oxidation process to remove the third sacrificial layer 119, etching damages resulted from the residuals of etching solutions being left at the cavities during a wet etching process used for removing the third sacrificial layer 119 may also be avoided.

To form the third sacrificial layer 119, a third sacrificial material layer covering the bottom electrode metal layer 117 and the third sub-dielectric layer 116 may be formed to fill the third openings 118. Then, a chemical mechanical planarization process may be used to flatten the third sacrificial material layer. Next, the third sacrificial material layer located outside the bottom electrode metal layer 117 may be removed to form the third sacrificial layer 119 on the bottom electrode metal layer 117.

Figure 16:
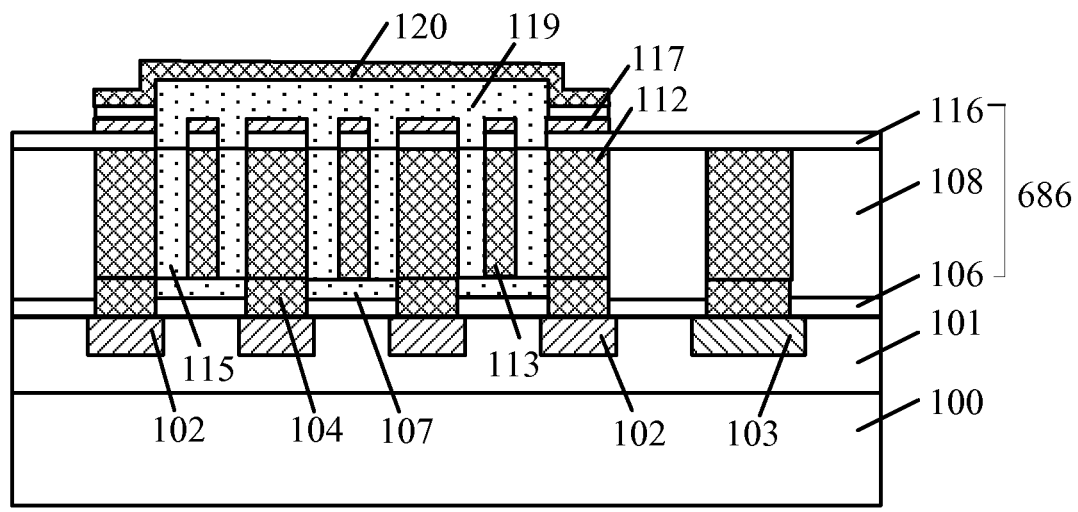

Returning to FIG. 21, a third electrode material layer is formed on the sidewalls and a top surface of the third sacrificial layer, and is used as a sensing film of the pressure sensor (S12). FIG. 16 illustrates a cross-sectional view of a corresponding structure of the exemplary MEMS device consistent with the disclosed embodiments.

As shown in FIG. 16, a third electrode material layer 120 may be formed on the sidewalls and a top surface of the third sacrificial layer 119 and may be used as a sensing film of the pressure sensor.

In one embodiment, the third electrode material layer 120 may be made of silicon germanium by a low temperature low pressure CVD process. The low temperature low pressure CVD process may avoid high temperature process damages to the integrated circuits in the substrate. In addition, the formed third electrode material layer 120 may have significantly smaller stress. Thus, when using the third electrode material layer 120 as a sensing film of the pressure sensor, deformation of the sensing film of the pressure sensor resulted from large stress may be avoided. The measuring accuracy of the pressure sensor may be guaranteed. Further, after removing the pressure force, the sensing film made of the silicon germanium may have desirable restoring capability to return to the original position from an offset displacement in response to a pressure force during a sensing process.

In one embodiment, the thickness of the third electrode material layer 120 may range approximately from 3500 angstroms to 4500 angstroms. The stress in the third electrode material layer 120 may range approximately from −20 MPa to 20 MPa. Further, the low temperature low pressure CVD process for forming the third electrode material layer 120 may use a silicon-containing source gas such as $SiH_4$ or $Si_2H_6$, and a germanium-containing source gas such as $GeH_2$. The chamber temperature may range approximately from 420° C. to 450° C. The chamber pressure may range approximately from 200 mTorr to 600 mTorr.

In addition, to increase the conductivity of the third electrode material layer 120, the silicon germanium may contain impurity ions. The impurity ion may be P-type impurity ions or N-type impurity ions. More specifically, the P-type impurity ions may be boron ions, gallium ions, indium ions, or a combination thereof. The N-type impurity ions may be phosphorus ions, arsenic ions, antimony ions, or a combination thereof. During the low temperature low pressure CVD process, certain impurity source gases containing the corresponding impurity elements may be supplied at the same time.

In one embodiment, the silicon germanium is doped with the boron ions. During the low temperature low pressure CVD process, the impurity source gas $B_2H_6$ or $BF_3$ is supplied.

Figure 17:
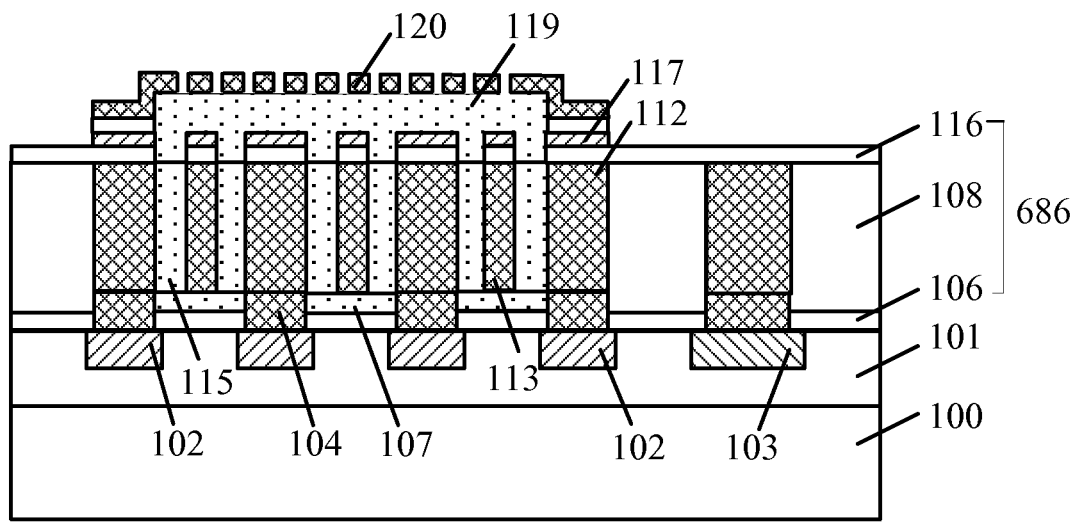

Returning to FIG. 21, one or more fourth openings are formed by etching the third electrode material layer, and the formed fourth openings expose the third sacrificial layer (S13). FIG. 17 illustrates a cross-sectional view of a corresponding structure of the exemplary MEMS device consistent with the disclosed embodiments.

Figure 18:
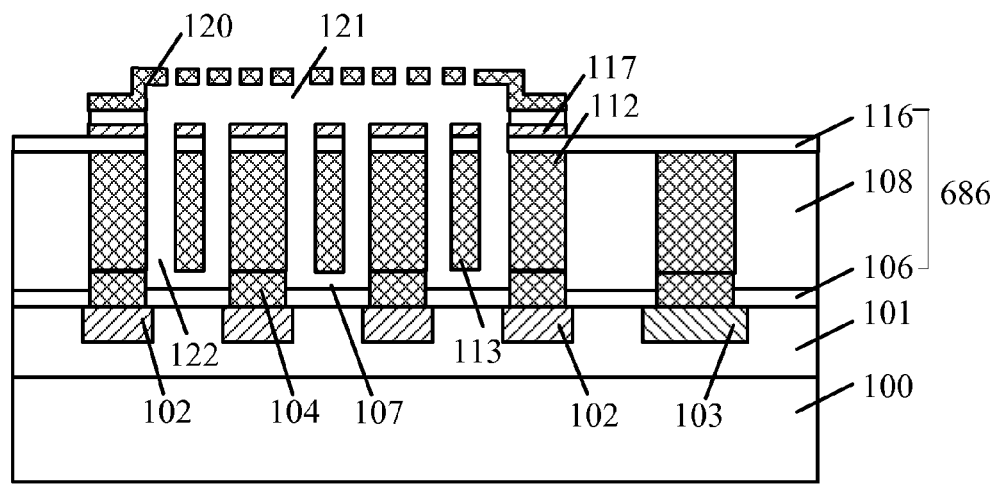

As shown in FIG. 17, the third electrode material layer 120 may be etched to form one or more fourth openings through the third electrode material layer 120. The formed fourth openings may expose the third sacrificial layer 119 (FIG. 18).

Prior to etching the third electrode material layer 120, a patterned mask layer may be formed on the third electrode material layer 120. Then, the third electrode material layer 120 may be etched using the patterned mask layer as an etch mask to form the fourth openings in the third electrode material layer 120.

Through the fourth openings, the third sacrificial layer 119, the second sacrificial layer 115 and the first sacrificial layer 107 may be subsequently removed.

The dimensions of the fourth openings may be sufficiently small. For example, the dimension of the fourth openings may range approximately from 0.5 µm to 0.6 µm. Thus, when forming a third dielectric layer subsequently, the fourth openings may be easily closed. In addition, when removing the first sacrificial layer, the second sacrificial layer and the third sacrificial layer, the oxygen gas traveling through the fourth openings may not be influenced.

Figure 19:
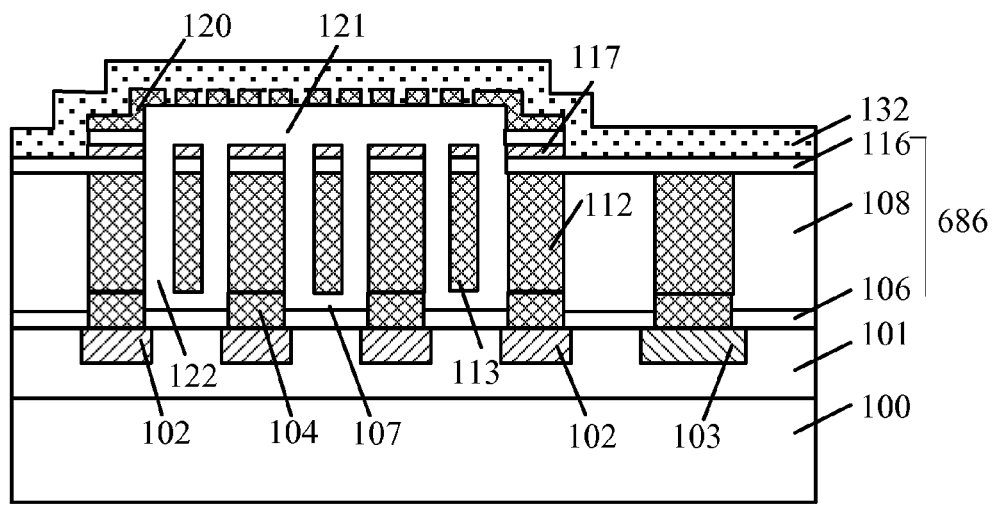

Returning to FIG. 21, a third dielectric layer covering the third electrode material layer and the third sub-dielectric layer is formed, and seals the fourth openings in the third electrode material layer (S14). FIG. 19 illustrates a cross-sectional view of a corresponding structure of the exemplary MEMS device consistent with the disclosed embodiments.

As shown in FIG. 19, a third dielectric layer 132 covering the third electrode material layer 120 and the third sub-dielectric layer 116 may be formed, and may seal (or fill up) the fourth openings in the third electrode material layer 120.

In one embodiment, the third dielectric layer 132 may be made of silicon oxide by a plasma enhanced chemical vapor deposition (PECVD) process. The thickness of the third dielectric layer 132 may range approximately from 19000 angstroms to 21000 angstroms. The PECVD process may use tetraethyl orthosilicate (TEOS) as the source gas. The third dielectric layer 132 formed by the PECVD process may have significant small stress, and the fourth openings may be easily closed up.

Returning to FIG. 21, a passivation layer is formed on the third dielectric layer (S15). FIG. 20 illustrates a cross-sectional view of a corresponding structure of the exemplary MEMS device consistent with the disclosed embodiments.

As shown in FIG. 20, a passivation layer 123 may be formed on the third dielectric layer 132.

The passivation layer 123 may protect the underneath pressure sensor. And, the passivation layer 123 may be made of silicon nitride, etc.

Prior to forming the passivation layer 123, the third dielectric layer 132 located above the third metal connections 103 and the second dielectric layer 686 (including portion of silicon germanium material) may be etched to form a plurality of first via holes in the third dielectric layer 132 and the second dielectric layer 686. The first via holes may expose the surface of the third metal connections 103. A plurality of second metal vias 124 may be formed by filling metal material into the first via holes.

Further, prior to forming the passivation layer 123, the third dielectric layer 132 may be etched to form a plurality of second via holes to expose the peripheral (or edge) region surface of the third electrode material layer 120. A plurality of third metal vias may be formed by filling metal material into the second via holes.

Further, prior to forming the passivation layer 123, the third dielectric layer 132 may be etched to form a plurality of third via holes to expose the peripheral (or edge) region surface of the bottom electrode metal layer 117. A plurality of fourth metal vias may be formed by filling metal material into the third via holes.

Further, after forming the passivation layer 123, a first external soldering pad 125, a second external soldering pad and a third external soldering pad may be formed in the passivation layer 123. The first external soldering pad 125 may be electrically connected to the second metal vias 124. The second external soldering pad may be electrically connected to the third metal vias. The third external soldering pad may be electrically connected to the third metal vias. The first external soldering pad 125, the second external soldering pad and the third external soldering pad may be used as connection terminals to connect the MEMS device to external electrical circuits.

Accordingly, the present disclosure provides a MEMS device. As shown in FIG. 20, an exemplary MEMS device consistent with the present disclosure may include a substrate 100 having integrated circuits formed inside and a first dielectric layer 101 located on the substrate 100. One or more first metal connection 102 and second metal connections (not shown) may be formed on the first dielectric layer 101. The first metal connections 102 may be electrically connected to the integrated circuits.

The MEMS device may further include a second dielectric layer 686 located on the first dielectric layer 101. In addition, at least one acceleration sensor may be formed in the second dielectric layer 686, and the acceleration sensor may be electrically connected to the first metal connections 102.

One or more first metal vias (not shown) may be located in the second dielectric layer, and the first metal vias may be electrically connected to the second metal connections. A pressure sensor can be located on the second dielectric layer and electrically connected to the first metal vias.

More specifically, the substrate 100 may be a semiconductor substrate. Certain semiconductor devices (not shown) such as transistors, resistors, capacitors, and/or inductors may be formed in the substrate. Then, the first dielectric layer 101 may be formed on the substrate 100. Certain interconnection structures (not shown) may be formed in the first dielectric layer 101. The interconnection structures may be connected to the semiconductor devices. The semiconductor devices and the interconnection structures may form the integrated circuits. The integrated circuits may process the electrical signals measured by the acceleration sensor and the pressure sensor.

Moreover, the second dielectric layer may include a first sub-dielectric layer 106, a second sub-dielectric layer 108 located on the first sub-dielectric layer 106, and a third sub-dielectric layer 116 located on the second sub-dielectric layer 108.

The acceleration sensor may further include one or more fixed electrodes 112; first cavities 122 located between adjacent fixed electrodes 112; and one or more overhung arms 113 located in the first cavity 122. The fixed electrodes 112 may be electrically connected to the first metal connections 102. Portion of first electrode material layers 104 may be used as the fixed electrodes 112. The fixed electrodes 112 and the overhung arms 113 may be located in the second sub-dielectric layer 108. The third sub-dielectric layer 116 may cover the top surfaces of the second sub-dielectric layer 108, the fixed electrodes 112 and the overhung arms 113.

The third sub-dielectric layer 116 covering the top surfaces of the fixed electrodes 112 and the overhung arms 113 may have a plurality of third sub-openings. The positions of the third sub-openings may correspond to the positions of the first cavities 122.

The acceleration sensor may further include the supporting structures 11 used for supporting the overhung arms 113. The supporting structures 11 may be located on portion of the first dielectric layer 106.

In one embodiment, portion of the overhung arms 113 may be arranged in parallel along a first direction (the y axis direction in FIG. 20), and may be located between the fixed electrodes 112 arranged along the first direction. The overhung arms 113 and the fixed electrodes 112 arranged along the first direction may form a first sub-acceleration sensor to detect the acceleration along the first direction. Further, portion of the overhung arms may be arranged in parallel along a second direction (not shown). The second direction may be perpendicular to the first direction, and in one embodiment, the second direction is in the x axis direction. The overhung arms 113 arranged in second direction may be located between the fixed electrodes arranged along the second direction. The overhung arms 113 and the fixed electrodes 112 arranged along the second direction may form a second sub-acceleration sensor to detect the acceleration along the second direction.

The overhung arms 113, the fixed electrodes 112, and the supporting structures 11 may be made of doped silicon germanium. The silicon germanium may contain impurity ions including P-type impurity ions and N-type impurity ions. The P-type impurity ions may be boron ions, gallium ions, indium ions, or a combination thereof. The N-type impurity ions may be phosphorus ions, arsenic ions, antimony ions, or a combination thereof. In one embodiment, the silicon germanium is doped with the boron impurity ions.

In various embodiments, the pressure sensor may be located above the acceleration sensor. Thus, the pressure sensor and the acceleration sensor may be integrated along the direction perpendicular to a top surface of the substrate 100. The size of the packaging structure may be reduced significantly, and the device integration level may be increased significantly. Further, the pressure sensor may include a bottom electrode metal layer 117, a sensing film 120 located above the bottom electrode metal layer 117, and a second cavity 121 located between the sensing film 120 and the bottom electrode metal layer 117.

The bottom electrode metal layer 117 may have a plurality of second sub-openings. The positions of the second sub-openings may correspond to the positions of the first sub-openings. The first sub-openings and the second sub-openings may form openings (or third openings). The first cavity 122 and second cavity 121 may connect through the openings.

Further, the third sub-dielectric layer 116 may be formed between the bottom electrode metal layer 117 and the fixed electrodes 112 (and the overhung arms 113) as an insulation layer. Through the etching holes in such insulation layer, the bottom electrode metal layer 117 formed in the etching holes may be electrically connected to the overhung arms 113 (or cantilevers) and/or the support structures 11. The bottom electrode metal layer 117 may be used as the bottom electrode of the pressure sensor. Moreover, the bottom electrode metal layer may also be used as the electrical connection to connect to the overhung cantilevers of the acceleration sensor. Thus, fabrication of additional metal wires to connect to the cantilevers may be avoided, simplifying the MEMS device structure.

The sensing film 120 may be made of doped silicon germanium.

The MEMS device may further include a third dielectric layer 132 coving the sensing film 120 and the third sub-dielectric layer 116. The thickness of the third dielectric layer 132 may range approximately from 19000 angstroms to 21000 angstroms.

The MEMS device may further include a passivation layer 123 located on the third dielectric layer 132; one or more third metal connections 103 formed in the first dielectric layer 101; one or more second metal vias 124 located in the second dielectric layer 686; and at least one first external soldering pad 125 located above the second metal vias 124.

The third metal connections 103 may be electrically connected to the integrated circuits. The second metal vias 124 may be electrically connected to the third metal connections 103.

In summary, the disclosed exemplary embodiments provide the following formation method of MEMS device. The acceleration sensor may be formed first on the substrate. The substrate may contain integrated circuits. Then, the pressure sensor may be formed above the acceleration sensor. Thus, the acceleration sensor and the pressure sensor may be integrated vertically on the substrate. Further, the acceleration sensor and the pressure sensor may be electrically connected to the integrated circuits in the substrate respectively. Because the pressure sensor may be formed above the acceleration sensor, the pressure sensor and the acceleration sensors may not interfere with each other when in operation. And the size of the MEMS device may be significantly reduced.

Further, the disclosed exemplary embodiments provide the MEMS device. The acceleration sensor may be formed first on the substrate. The substrate may contain integrated circuits. Then, the pressure sensor may be formed above the acceleration sensor. Thus, the acceleration sensor and the pressure sensor may be integrated vertically on the substrate. Further, the acceleration sensor and the pressure sensor may be electrically connected to the integrated circuits in the substrate respectively. Because the pressure sensor may be formed above the acceleration sensor, the pressure sensor and the acceleration sensors may not interfere with each other when in operation. And the size of the MEMS device may be significantly reduced.

In addition the pressure sensor may include the bottom electrode metal layer, the sensing film located above the bottom electrode metal layer, and the second cavity located between the sensing film and the bottom electrode metal layer. Further, the bottom electrode metal layer and the fixed electrode may have an insulation layer there-between. The bottom electrode metal layer may be electrically connected to the overhung arms (or cantilevers). The bottom electrode metal layer may be used as the bottom electrode of the pressure sensor. Moreover, the bottom electrode metal layer may also be used as the electrical connection to connect to the overhung cantilevers of the acceleration sensor. Thus, fabrication of additional metal wires to connect to the cantilevers may be avoided, simplifying the MEMS device structure.

Embodiments consistent with the current disclosure provide a MEMS device and formation method thereof. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. A method for forming a MEMS device, comprising:
   providing a substrate including integrated circuits therein;
   forming a first dielectric layer on the substrate;
   forming one or more first metal connections and second metal connections in the first dielectric layer, wherein the first metal connections and the second metal connections are electrically connected to the integrated circuits;
   forming a second dielectric layer on the first dielectric layer;
   forming an acceleration sensor within the second dielectric layer, the acceleration sensor being electrically connected to one or more first metal connections,
   wherein the acceleration sensor includes a first sub-acceleration sensor including overhung arms and fixed electrodes arranged along a first direction and a second sub-acceleration sensor including the overhung arms and the fixed electrodes arranged along a second direction, wherein the second direction is perpendicular to the first direction;
   forming one or more first metal vias in the second dielectric layer, the first metal vias being electrically connected to the second metal connections; and
   forming a pressure sensor vertically above the second dielectric layer containing the acceleration sensor, the pressure sensor being electrically connected to the first metal vias.

2. The method according to claim 1, wherein the step of forming the acceleration sensor includes:
   forming one or more first metal electrode material layers having first openings between adjacent first metal electrode material layers on the first metal connections;
   forming a first sub-dielectric layer having a top surface lower than a top surface of the first electrode material layers in the first openings and on portions of the first dielectric layer;
   forming a first sacrificial layer having a top surface coplanar with the top surface of the first electrode material layers on the first sub-dielectric layer located in the first openings; and
   forming a second sub-dielectric layer covering the first sub-dielectric layer, forming one or more second openings in the second sub-dielectric layer to expose the first sacrificial layer and the first electrode material layers;
   filling the second openings to form a second electrode material layer;
   etching the second electrode material layer on the first sacrificial layer to form the overhung arms used as movable electrodes of the acceleration sensor, with remaining second electrode material layer located on the first electrode material layer used as fixed electrodes of the acceleration sensor, wherein gaps are formed between the overhung arms and the fixed electrodes;
   filling the gaps to form a second sacrificial layer;
   forming a third sub-dielectric layer on the overhung arms, on the second sacrificial layer, and on the second sub-dielectric layer, wherein the first sub-dielectric layer, the second sub-dielectric layer, and the third sub-dielectric layer form the second dielectric layer.

3. The method according to claim 2, wherein the step of forming the pressure sensor includes:
   forming a bottom electrode metal layer on the third sub-dielectric layer above the second sacrificial layer, the bottom electrode metal layer being the bottom electrode of the pressure sensor;
   etching the bottom electrode metal layer and the third sub-dielectric layer to form one or more third openings in the bottom electrode metal layer and in the third sub-dielectric layer, wherein the third openings expose the second sacrificial layer, and positions of the third openings correspond to positions of the gaps between the overhung arms and the fixed electrodes;
   forming a third sacrificial layer to fill the third openings on the bottom electrode metal layer;

forming a third electrode material layer on sidewalls and a top surface of the third sacrificial layer, wherein the third electrode material layer is used as a sensing film of the pressure sensor;

etching the third electrode material layer to form one or more fourth openings to expose the third sacrificial layer; and removing the third sacrificial layer through the fourth openings to form a second cavity, removing the first sacrificial layer and the second sacrificial layer through the second and the third openings to form a first cavity and to release the overhung arms.

4. The method according to claim 3, wherein:
the first sacrificial layer, the second sacrificial layer, and the third sacrificial layer are made of amorphous carbon.

5. The method according to claim 3, wherein:
the first sacrificial layer, the second sacrificial layer, and the third sacrificial layer are removed by a low temperature tube oxidation process using oxygen gas having a temperature ranging approximately from 180° C. to 250° C.

6. The method according to claim 3, wherein:
the first electrode material layer, the second electrode material layer, and the third electrode material layer are made of doped silicon germanium.

7. The method according to claim 6, wherein:
the impurity ions of the doped silicon germanium are P-type impurity ions or N-type impurity ions, and
the P-type impurity ions include boron ions, gallium ions, indium ions or a combination thereof, and the N-type impurity ions include phosphorus ions, arsenic ions, antimony ions or a combination thereof.

8. The method according to claim 3, wherein:
the first electrode material layer, the second electrode material layer, and the third electrode material layer each has a stress ranging approximately from −20 MPa to 20 MPa.

9. The method according to claim 8, wherein:
the first electrode material layer, the second electrode material layer, and the third electrode material layer are formed by a low temperature low pressure chemical vapor deposition process including:
a silicon-containing source gas including $SiH_4$, $Si_2H_6$, or a combination thereof;
a germanium-containing source gas including $GeH_2$;
a chamber temperature ranging approximately from 420° C. to 450° C.; and
a chamber pressure ranging approximately from 200 mTorr to 600 mTorr.

10. The method according to claim 3, wherein:
the bottom electrode metal layer is electrically connected to the overhung arms through the etching holes in the third sub-dielectric layer.

11. The method according to claim 3, wherein:
a thickness of the first electrode material layer ranges approximately from 4500 angstrom to 5500 angstroms;
a thickness of the second electrode material layer ranges approximately from 19000 angstroms to 21000 angstroms; and
a thickness of the third electrode material layer ranges approximately from 3500 angstroms to 4500 angstroms.

12. The method according to claim 3, further including:
forming a third dielectric layer on the third electrode material layer; and
forming a passivation layer on the third dielectric layer.

13. The method according to claim 12, further including:
forming one or more third metal connections in the first dielectric layer,
forming one or more second metal vias in the second and the third dielectric layer electrically to connect to the one or more third metal connections, and
forming at least one first external soldering pad on the second metal vias.

14. The method according to claim 2, wherein:
the first sub-dielectric layer, the second sub-dielectric layer, and the third sub-dielectric layer are made of silicon oxide.

15. The method according to claim 1, wherein, in the acceleration sensor,
the fixed electrodes are connected to the first metal connections,
a first cavity is formed between adjacent fixed electrodes, and
the overhung arms are located in the first cavity.

16. The method according to claim 15, wherein the pressure sensor includes:
a bottom electrode metal layer,
a sensing film located above the bottom electrode metal layer,
a second cavity located between the bottom electrode metal layer and the sensing film, and
one or more openings located in the bottom electrode metal layer, having a position corresponding to a position of the first cavity, wherein the first cavity is connected to the second cavity through the openings.

17. The method according to claim 16, wherein an insulation layer is formed between the bottom electrode metal layer and the fixed electrodes, wherein the bottom electrode metal layer is electrically connected to the overhung arms further through etching holes in the insulation layer.

18. A method for forming a MEMS device, comprising:
providing a substrate including integrated circuits therein;
forming a first dielectric layer on the substrate;
forming one or more first metal connections and second metal connections in the first dielectric layer, wherein the first metal connections and the second metal connections are electrically connected to the integrated circuits;
forming a second dielectric layer on the first dielectric layer;
forming an acceleration sensor in the second dielectric layer, the acceleration sensor being electrically connected to one or more first metal connections,
forming one or more first metal vias in the second dielectric layer, the first metal vias being electrically connected to the second metal connections; and
forming a pressure sensor on the second dielectric layer, the pressure sensor being electrically connected to the first metal vias,
wherein the step of forming the acceleration sensor includes:
forming one or more first metal electrode material layers having first openings between adjacent first metal electrode material layers on the first metal connections;
forming a first sub-dielectric layer having a top surface lower than a top surface of the first electrode material layers in the first openings and on portions of the first dielectric layer;
forming a first sacrificial layer having a top surface coplanar with the top surface of the first electrode material layers on the first sub-dielectric layer located in the first openings; and forming a second sub-dielectric layer covering the first sub-dielectric layer, forming one or more second openings in the second sub-dielectric layer to expose the first sacrificial layer and the first electrode material layers;

filling the second openings to form a second electrode material layer;

etching the second electrode material layer on the first sacrificial layer to form one or more arms used as movable electrodes of the acceleration sensor, with remaining second electrode material layer located on the first electrode material layer used as fixed electrodes of the acceleration sensor, wherein gaps are formed between the arms and the fixed electrodes;

filling the gaps to form a second sacrificial layer;

forming a third sub-dielectric layer on the arms, on the second sacrificial layer, and on the second sub-dielectric layer, wherein the first sub-dielectric layer, the second sub-dielectric layer, and the third sub-dielectric layer form the second dielectric layer.

* * * * *